United States Patent
Gong et al.

(10) Patent No.: US 9,564,563 B2
(45) Date of Patent: Feb. 7, 2017

(54) IMPROVING DISPLAY CONTRAST (71) Applicant: Oculus VR, LLC, Menlo Park, CA (US)

(72) Inventors: Zheng Gong, Scotstoun (GB); James Small, Langbank (GB); James Ronald Bonar, Erskine (GB)

(73) Assignee: Oculus VR, LLC, Menlo Park, CA (US)

( * ) Notice: Subject to any disclaimer, the term of this patent is extended or adjusted under 35 U.S.C. 154(b) by 0 days.

(21) Appl. No.: 13/261,922

(22) PCT Filed: Dec. 19, 2012

(86) PCT No.: PCT/GB2012/053192
§ 371 (c)(1),
(2) Date: Jun. 20, 2014

(87) PCT Pub. No.: WO2013/093464
PCT Pub. Date: Jun. 27, 2013

(65) Prior Publication Data
US 2014/0361322 A1    Dec. 11, 2014

(30) Foreign Application Priority Data
Dec. 20, 2011   (GB) .................................. 1121864.1

(51) Int. Cl.
*H01L 29/205*   (2006.01)
*H01L 33/58*   (2010.01)
(Continued)

(52) U.S. Cl.
CPC ............ *H01L 33/58* (2013.01); *H01L 27/15* (2013.01); *H01L 27/156* (2013.01);
(Continued)

(58) Field of Classification Search
CPC ..... H01L 51/50; H01L 2227/32; H01L 25/048
See application file for complete search history.

(56) References Cited

U.S. PATENT DOCUMENTS

2002/0015013 A1   2/2002  Ragle
2004/0051118 A1*  3/2004  Bruhns et al. ................ 257/200
(Continued)

FOREIGN PATENT DOCUMENTS

JP    2002043614 A    2/2002
JP    2002353519 A   12/2002
(Continued)

OTHER PUBLICATIONS

Zhao Jun Liu et al., Monolithic LED Microdisplay on Active Matrix Substrate Using Flip-Chip Technology, IEEE Journal of Selected Topics in Quantum Electronics, IEEE Service Center, Piscataway, NJ, US, vol. 15, No. 4, Jul. 1, 2009 (1298-1302).
(Continued)

*Primary Examiner* — Elias M Ullah
(74) *Attorney, Agent, or Firm* — Fenwick & West LLP (57) ABSTRACT

There is herein described electronic components with improved display contrast and a method of manufacturing such electronic components. More particularly, there is described electronic components having improved display contrast by using a non-transparent or substantially non-transparent material (520) to block light from an emitter source (512, 514, 516) to surrounding components such as emitters, sensors or components of this nature.

24 Claims, 6 Drawing Sheets (51) Int. Cl.
*H01L 27/15* (2006.01)
*H01L 33/00* (2010.01)
*H01L 33/56* (2010.01)

(52) U.S. Cl.
CPC ............ *H01L 33/005* (2013.01); *H01L 33/56* (2013.01); *H01L 2933/0058* (2013.01)

(56) References Cited

U.S. PATENT DOCUMENTS

2006/0110839 A1* 5/2006 Dawson et al. ................ 438/22
2010/0102333 A1* 4/2010 Choi et al. ..................... 257/79
2011/0244667 A1* 10/2011 Hirao .................. H01L 33/0079
438/479

FOREIGN PATENT DOCUMENTS

| WO | 9318555 | A1 | 9/1993 |
| WO | 2011014490 | A2 | 2/2011 |
| WO | 2011071559 | A1 | 6/2011 |

OTHER PUBLICATIONS

EPO Saerch Report, PCT/GB2012/053192, Mar. 21, 2013.

\* cited by examiner

1) LED mesa structure formed by dry etch

Fig. 7

2) Defining Pixel

Fig. 8

3) N-bus formation

Fig. 9

4) Polyimide coating

Fig. 10

5) Polyimide open/curing

Fig. 11

5) Spreading metal/annealing

Fig. 12

7) p-metal

Fig. 13

Top emitting

Backside emitting

Fig. 14

IMPROVING DISPLAY CONTRAST

FIELD OF THE INVENTION

The present invention relates to electronic components with improved display contrast and a method of manufacturing such electronic components. More particularly, the present invention relates to electronic components having improved display contrast by using a non-transparent or substantially non-transparent material to block light from an emitter source to surrounding components such as emitters, sensors or components of this nature.

BACKGROUND OF THE INVENTION

Polyimide is commonly used for planarizing semiconductor devices and to provide electrical isolation between interconnected structures. A good example has been demonstrated by Horng et al. in US patent application 2011/0092005, which is incorporated herein by reference. A parallel addressed array of macro LEDs with improved reliability was achieved by using polyimide to fill the gap between the macro LEDs. Another common application is polyimide encapsulation of LEDs to improve the light extraction efficiency because of the increased refractive index such as described by Chen et al. in US patent application 2011/0024720, which is incorporated herein by reference. In contrast to the proposed present invention the polyimide used in these applications is transparent or what is known as having a high optical clarity.

This document is applicable to all LED arrays. For the description provided it is mainly concerned with the difficulties in manufacturing micro-LED structures which in this case will refer to any LED structure of less than 100 microns diameter. There are a number of known and existing problems with micro-LED arrays. For example, there is strong optical crosstalk between adjacent pixels in conventional LED arrays, resulting in the LED display having poor contrast. To form a matrix-addressable LED array, isolated LED mesa columns need to be formed by dry etch. The large height difference, the sloped mesa and the sharp edges formed in the trench cause undesirable light scattering (bars surrounding the pixels), and thus reduce the display contrast of the LED array.

A further known problem with LED arrays is a reliability issue associated with the isolation layer. Conventionally, the isolation layer of p-contacts from n-contacts of a matrix LED array is made from dielectric materials (e.g. silicon oxide or silicon nitride). For instance, Dawson et al. in US patent US2006/0110839 A1, which is incorporated herein by reference, uses $SiO_2$ to isolate the mesa with sloped sidewall. Although the sloped mesa can alleviate the step coverage issue of the dielectric layer normally associated with standard techniques, the device made this way can still have reliability issues, resulting in undesirable electric crosstalk or shorting. This is mainly due to the fact that the thin dielectric layer cannot reliably cover the mesa with a large height, and it may be stripped off during subsequent process due to possible adhesion issues. All of these factors mean that the devices need to be carefully manufactured to ensure that the sidewall is suitably angled and that there are no contaminants (e.g. pin-holes) which could cause electrical crosstalk.

The present invention seeks to overcome these said disadvantages and problems.

It is an object of at least one aspect of the present invention to obviate or mitigate at least one or more of the aforementioned problems.

It is a further object of at least one aspect of the present invention to provide improved micro-LED arrays with improved display contrast and reduced optical cross-talk.

It is a further object of at least one aspect of the present invention to provide an improved method for manufacturing micro-LED arrays with improved display contrast and reduced optical cross-talk.

SUMMARY OF THE INVENTION

According to a first aspect of the present invention there is provided an array of integrated LED devices. This may involve a micro-LED array comprising:

at least two raised mesa areas;

located between the at least two raised mesa areas there is a trench;

on the upper surface of the at least two raised mesa areas there are pixels and N-bus formations along with an annealed metal area and a p-metal layer;

wherein the trench is at least partially filled with a non-transparent or substantially non-transparent material capable of blocking light emitted from within the micro-LED array.

The present invention therefore resides in the provision of using a non-transparent or substantially non-transparent material to block light from an emitter source to surrounding components such as emitters, sensors or components of this nature. This non-transparent or substantially non-transparent material is used to reduce unwanted crosstalk and thereby provide improved display contrast for micro-LED arrays and the like.

The non-transparent or substantially non-transparent material may therefore fill the trench in adjacent pixels. Although the actual thickness of the deposited non-transparent or substantially non-transparent material is not important sufficient material should be introduced so that redirected light should be absorbed and prevented from being emitted from the upper surface.

The non-transparent or substantially non-transparent material may fully occupy the trench or may simply form a layer.

The non-transparent or substantially non-transparent material may be seen as functioning as an interlayer dielectric.

The non-transparent or substantially non-transparent material may be selected from any appropriate material that is capable of blocking light. For example, the material may be selected from any suitable polymeric material such as anyone of or combination of the following: polyimide; epoxy; and benzocyclobutene.

In particular embodiments there is a combination of different polymers forming a light blocking layer. For example, there may be a combination of polymer and other dielectric layers such as but not limited to silicon nitride and/or silicon dioxide.

The non-transparent or substantially non-transparent material forms a layer which is non-transparent or substantially non-transparent to light at the emission wavelength of the micro-LED array. The non-transparent or substantially non-transparent material may therefore be matched to block the light emitted from the micro-LED array. The material may be designed to have a non-transparent surface layer or graded non-transparent layer.

A further advantage of the non-transparent or substantially non-transparent material in polymeric form is that the polymeric layer allows metals such as deposited p-metal layer to be conformably deposited thereby further reducing the light scattering from the trench (i.e. cavity). The polymeric material may also provide optical and electrical isolation between emitters of varying wavelength emissions and/or of different structural design and/or other integrated components.

It has been found that the deposited non-transparent or substantially non-transparent material may also function to effectively isolate each pixel and p-contact from n-contacts, thereby eliminating the undesirable electric crosstalk and improving the device reliability.

According to a second aspect of the present invention there is provided a method of manufacturing a micro-LED array comprising:

forming at least two raised mesa areas wherein located between the at least two raised mesa areas there is a trench;

on the upper surface of the at least two raised mesa areas forming pixels and N-bus formations along with an annealed metal area and a p-metal layer; and wherein the trench is at least partially filled with a non-transparent or substantially non-transparent material capable of blocking light emitted from within the micro-LED array.

The manufactured micro-LED array may be as defined in the first aspect.

The mesa areas may be formed using a dry etch technique.

The non-transparent or substantially non-transparent material may be deposited into the trench using any suitable deposition technique to form a layer or fully fill the trench up to the same level as the height of the mesa areas.

The non-transparent or substantially non-transparent material may be cured.

The pixels and N-bus formations may be formed on the upper surface of the mesa areas using any suitable technique.

A metal layer (e.g. a p layer) may be formed onto etched areas on the upper surface of the mesa areas.

According to a third aspect of the present invention there is provided a flip-chip device comprising non-transparent or substantially non-transparent material capable of blocking light.

BRIEF DESCRIPTION OF THE DRAWINGS

Embodiments of the present invention will now be described, by way of example only, with reference to the accompanying drawings in which.

BRIEF DESCRIPTION

Generally speaking, the present invention resides in the provision of using a non-transparent or substantially non-transparent material to block light from an emitter source to surrounding components such as emitters, sensors or components of this nature. This non-transparent material is used to reduce unwanted crosstalk and thereby provide improved display contrast for micro-LED arrays and the like.

Figure 1:
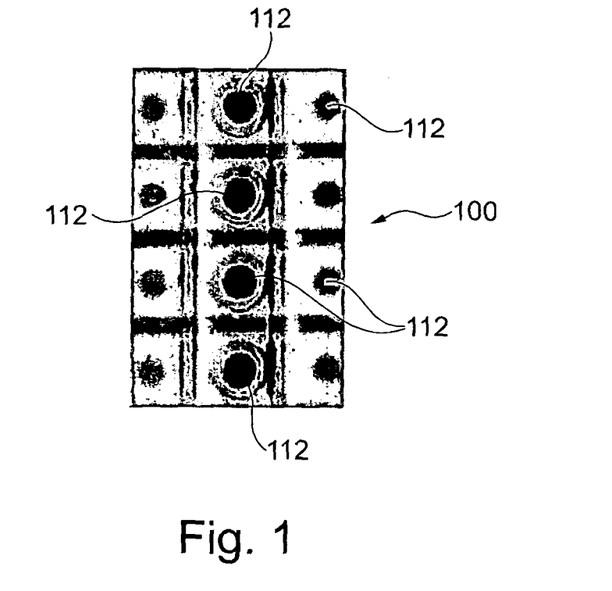
FIGS. 1 and 2 are micro-LED arrays according to the prior art showing significant crosstalk.
Figure 2:
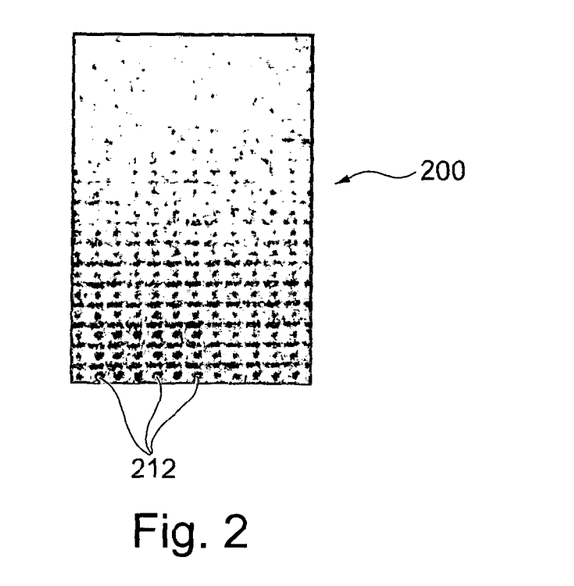

FIGS. 1 and 2 are views of arrays according to the prior art generally designated 100, 200 where there are a plurality of LEDs 112, 212 showing significant crosstalk between them. The LEDs 112, 212 when activated have a 'halo' effect and show poor display contrast. In the array 100 there is a block of LEDs 112 where there is poor contrast with as much as 20% of the light measured from the surrounding area outside the area of the LED 112.

Figure 3:
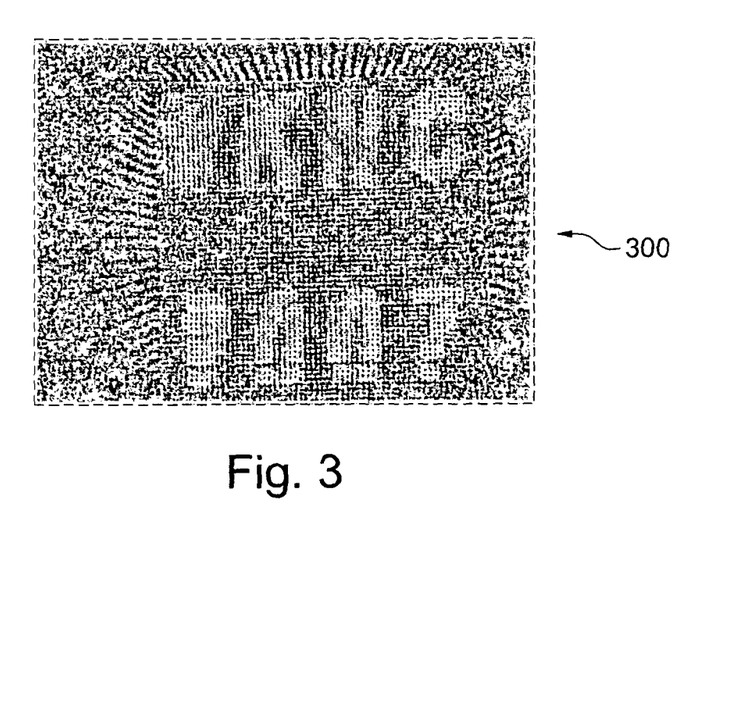
FIG. 3 is a micro-display image from a conventional matrix device using $SiO_2$ as the isolation layer between mesa and from the image where electric crosstalk and open circuit (due to metal coverage issue on the $SiO_2$) are evident.

FIG. 3 is a micro-display image 300 from a conventional matrix device according to the prior art using $SiO_2$ as the isolation layer between mesa and from the image. Electric crosstalk and an open circuit (due to metal coverage issue on the $SiO_2$) are evident due to the very poor image contrast.

Figure 4:
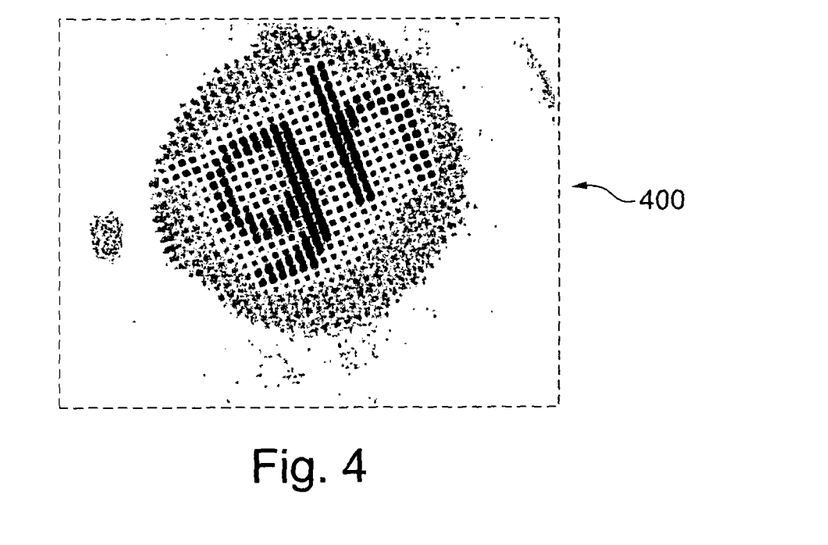
FIG. 4 is a micro-display image from a micro-LED array device according to the present invention where there is no electric crosstalk and open circuit are observed.

FIG. 4 is a micro-display image from a micro-LED array device 400 according to the present invention where there is no electric crosstalk and open circuit are observed. There is therefore a much improved image contrast.

Figure 5:
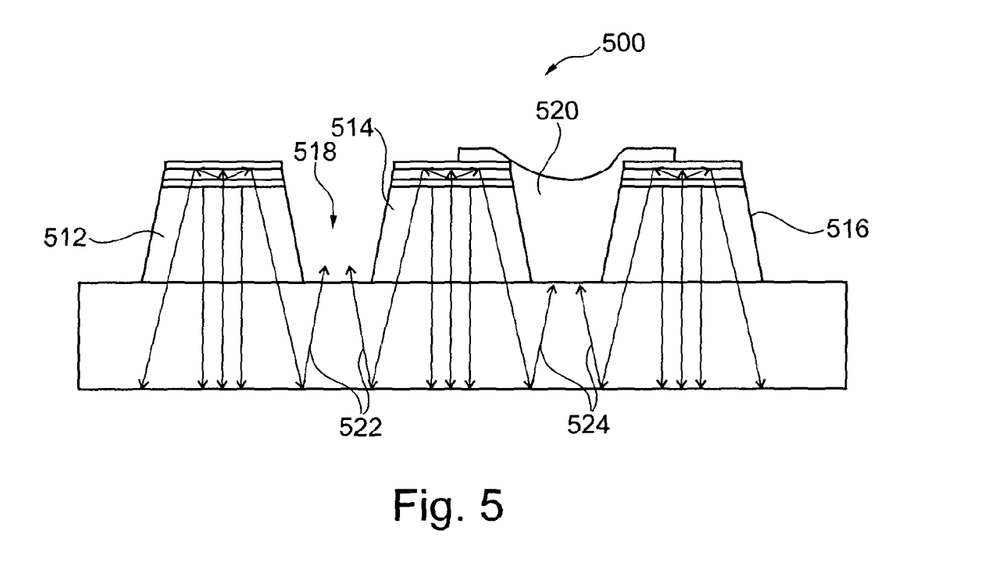
FIG. 5 is a cross-sectional side view of a micro-LED array according to the present invention.

FIG. 5 is a cross-sectional side view of a micro-LED array 500 according to the present invention. As shown in FIG. 5 there are three mesa regions generally designated 512, 524, 516. The mesa regions 512, 524, 516 protrude upwards and have flat top sections in the form of, for example, truncated cones. The important aspect to note from FIG. 5 is that between mesa regions 512 and 514 there is an open space 518 (i.e. a trench) and no in-filling. Between mesa regions 514 and 516 the space is filled with a non-transparent or substantially non-transparent material 520 to block light. For example, the non-transparent or substantially non-transparent material 520 is a polyimide. In the trench between mesa regions 512 and 514, FIG. 5 shows that light rays 522 exit the lower surface and enter the open space 518 area and are therefore capable of reducing display contrast. In the trench between mesa regions 514 and 516 the non-transparent or substantially non-transparent material 520 blocks the lights rays 524 and prevents the light rays contaminating the area around the LED light emitting areas thereby maintaining a high display contrast.

In the present invention the non-transparent or substantially non-transparent material 520 is therefore introduced (e.g. deposited) to fill the trench between adjacent pixels. Although the actual thickness of the deposited non-transparent or substantially non-transparent material 520 is not important sufficient material should be introduced so that redirected light should be absorbed and prevented from being emitted from the upper surface. The thickness of the non-transparent or substantially non-transparent material 520 may be more or less than the thickness of the mesa structure. Consequently, the light from the LED sidewall can enter the polyimide at a larger range of incident angle owing to the increase in refractive index where the light is then absorbed or partially absorbed by the polymer layer. This helps to further improve display contrast.

The deposited non-transparent or substantially non-transparent material 520 can also function to compensate the height difference of different mesa regions, such that the metal layer on the polyimide can be deposited in a conformal layer, further reducing the light scattering from the trench.

The deposited non-transparent or substantially non-transparent material 520 can also function to effectively isolate each pixel and p-contact from n-contacts, thereby eliminating the undesirable electric crosstalk and improving the device reliability.

Owing to the large refractive index difference between the semiconductor and surrounding mediums a significant portion of the light is typically trapped in the semiconductor layer which leads to phonon recombination effects causing unwanted and potentially damaging thermal build-up. The introduction of a polymer results in more of the light "escaping" plus increases the volume of material and the thermal conductivity to improve heat dissipation. An opaque polymer surface layer can also be formed by annealing the polymer in an oxygen atmosphere.

Figure 6:
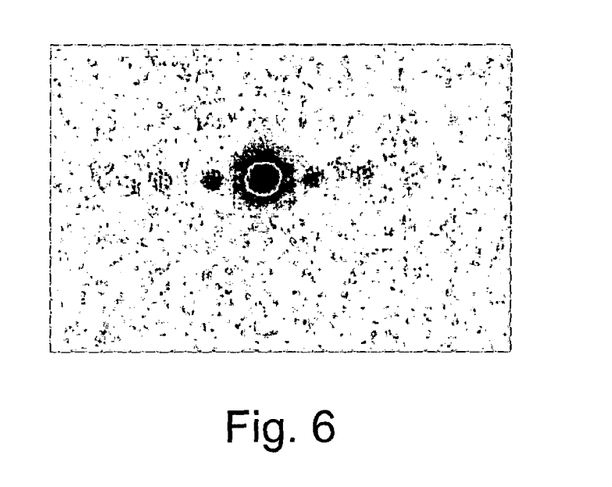
FIG. 6 is a top view of a micro-LED array according to the present invention.

FIG. 6 is a top view of a micro-LED array 600 according to the present invention where non-transparent or substantially non-transparent material is deposited to fill the trench in adjacent pixels. The emitting LED therefore has a very good display contrast and has a much reduced 'halo' effect and crosstalk. The contrast between the LED emitter and the surrounding area is therefore high.

Figure 7:
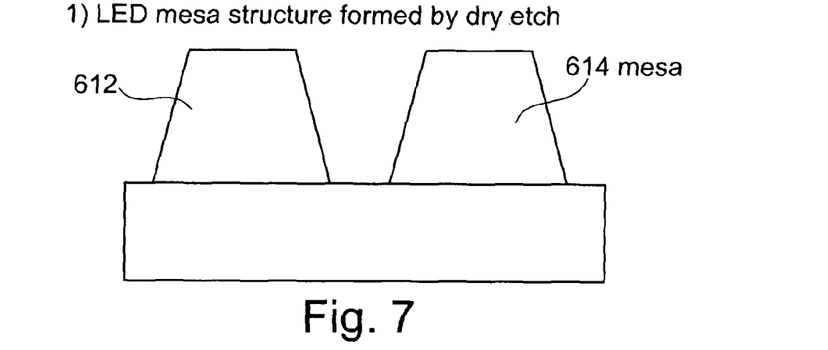
FIGS. 7 to 14 show a method of forming micro-LED arrays according to the present invention.
Figure 8:
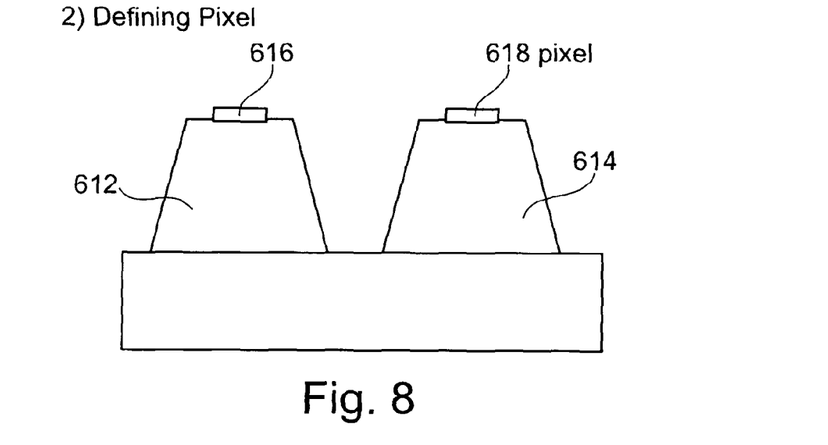
Figure 9:
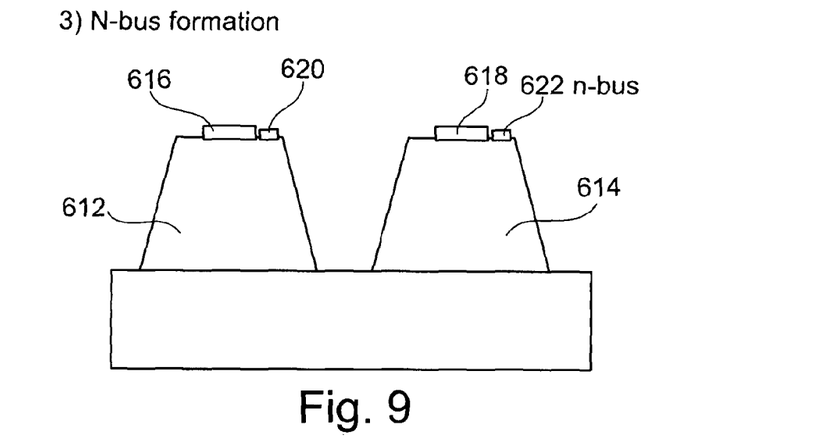
Figure 10:
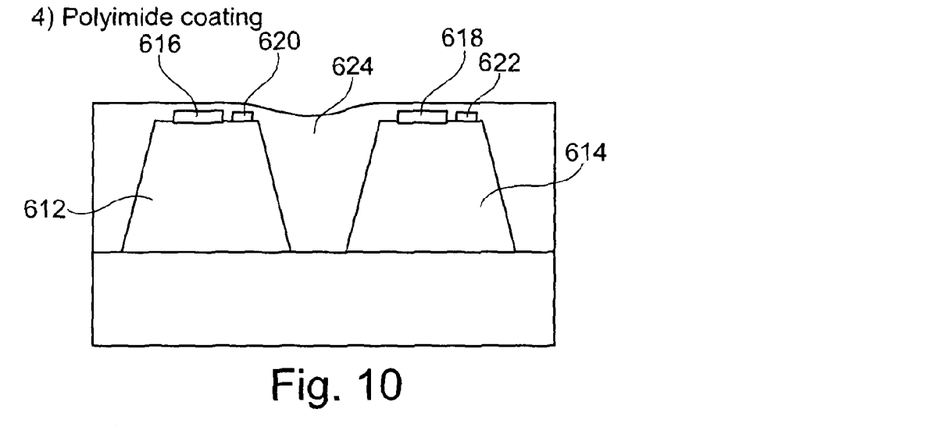
Figure 11:
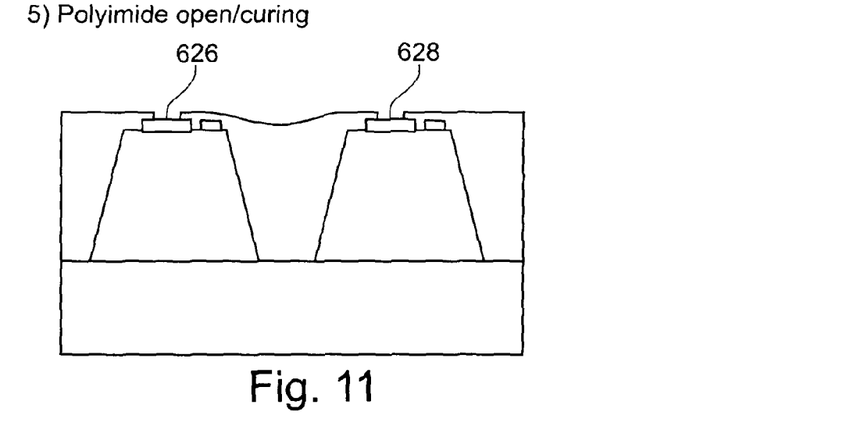
Figure 12:
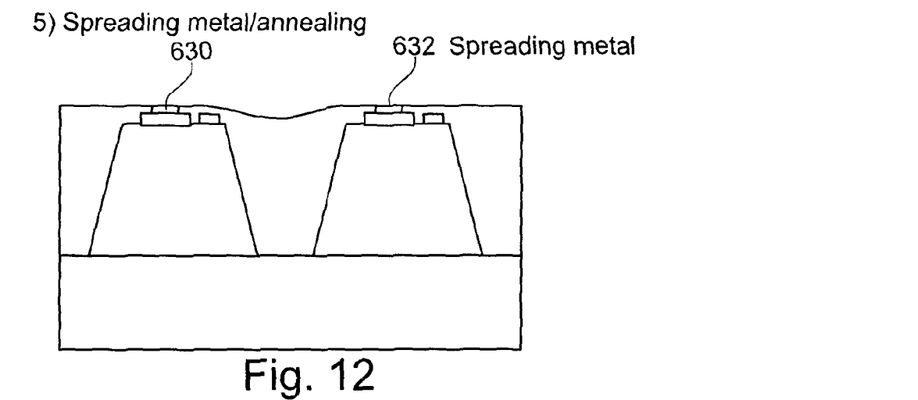
Figure 13:
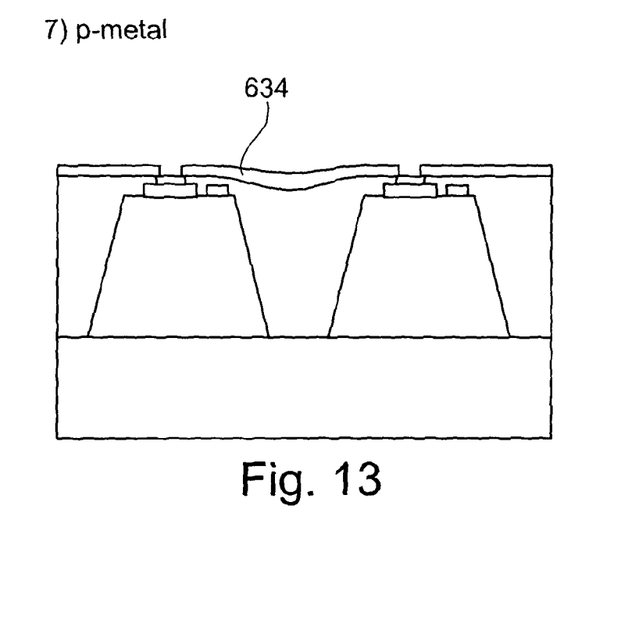
Figure 14:
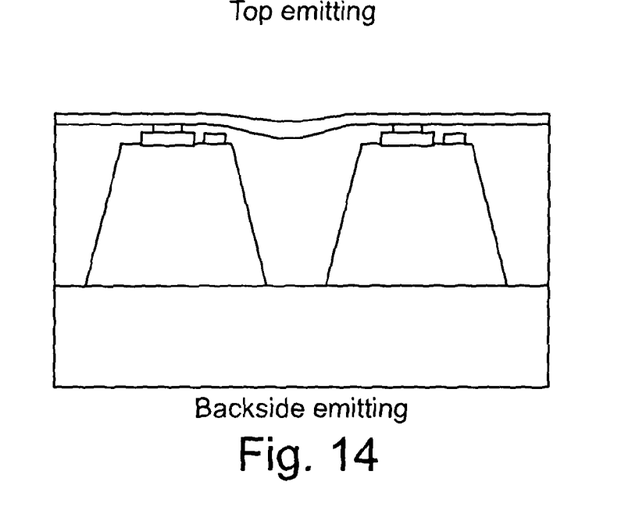

FIGS. 7 to 14 show a method of forming micro-LED arrays according to the present invention. FIG. 7 shows two mesa regions 612, 614 formed by dry etch. In FIG. 8, two pixels 616, 618 are formed on the upper surface of the mesa regions 612, 614. FIG. 9 shows N-bus formation 620, 622 on the upper surface on the mesa regions 612, 614. In FIG. 10 a non-transparent or substantially non-transparent material (e.g. polyimide) 624 is deposited to fill the trench between pixels and as shown extends over the upper surface of the mesa regions 612, 614 and the pixels 616, 618 and the N-bus formations 620, 622. FIG. 11 then shows there is curing of the non-transparent or substantially non-transparent material (e.g. polyimide) 624 with areas 626, 628 etched above the pixels 616, 618. As shown in FIG. 12 metal 630, 632 is spread into and annealed into the etched areas 626, 628. A p-metal 634 is then deposited as shown in FIG. 13. FIG. 14 shows the final array which can be topside and backside emitting.

Whilst specific embodiments of the present invention have been described above, it will be appreciated that departures from the described embodiments may still fall within the scope of the present invention. For example, any suitable type of non-transparent or substantially non-transparent material may be used to block light and improve the display contrast on not only array devices but also flip-chip devices.

The invention claimed is:

1. An LED array, comprising:
   at least two raised mesa areas;
   located between the at least two raised mesa areas there is a trench;
   on the upper surface of the at least two raised mesa areas there are pixels and N-bus formations along with an annealed metal area and a p-metal layer;
   wherein the trench is at least partially filled with a non-transparent or substantially non-transparent material capable of blocking light emitted from within the LED; and
   wherein the non-transparent or substantially non-transparent material is selected from any suitable polymeric material such as any one of or any combination of the following: polyimide; epoxy; and benzocyclobutene.

2. An LED array according to claim 1, wherein the LED array is a micro-LED array.

3. An LED array according to claim 1, wherein the non-transparent or substantially non-transparent material is used to reduce unwanted crosstalk and thereby provide improved display contrast for LED and micro-LED arrays.

4. An LED array according to claim 1, wherein the non-transparent or substantially non-transparent material therefore fills the trench in-between adjacent pixels.

5. An LED array according to claim 1, wherein sufficient material should be introduced so that redirected light should be absorbed and preventing from being emitted from the upper surface.

6. An LED array according to claim 1, wherein the non-transparent or substantially non-transparent material fully occupies the trench or simply forms a layer.

7. An LED array according to claim 1, wherein the non-transparent or substantially non-transparent material functions as an interlayer dielectric.

8. An LED array according to claim 1, wherein the non-transparent or substantially non-transparent material is selected from any appropriate material that is capable of blocking light.

9. An LED array according to claim 1, wherein there is a combination of different polymers forming a light blocking layer; and wherein there is a combination of polymer and other dielectric layers comprising at least one of a silicon nitride and silicon dioxide.

10. An LED array according to claim 1, wherein the non-transparent or substantially non-transparent material forms a layer which is non-transparent or substantially non-transparent to light at the emission wavelength of the LED array.

11. An LED array according to claim 1, wherein the non-transparent or substantially non-transparent material in polymeric form allows metals such as deposited p-metal layer to be conformably deposited thereby further reducing the light scattering from the trench; and wherein the polymeric material also provides optical and electrical isolation between emitters or between an emitter and any adjacent structure.

12. An LED array according to claim 1, wherein the deposited non-transparent or substantially non-transparent material also functions to effectively isolate each pixel and p-contact from n-contacts, thereby eliminating the undesirable electric crosstalk and improving the device reliability.

13. An LED array, comprising:
   at least two raised mesa areas;
   located between the at least two raised mesa areas there is a trench;
   on the upper surface of the at least two raised mesa areas there are pixels and N-bus formations along with an annealed metal area and a p-metal layer;
   wherein the trench is at least partially filled with a non-transparent or substantially non-transparent material capable of blocking light emitted from within the LED;
   wherein there is a combination of different polymers forming a light blocking layer; and
   wherein there is a combination of polymer and other dielectric layers comprising at least one of a silicon nitride and silicon dioxide.

14. An LED array according to claim 13, wherein the LED array is a micro-LED array.

15. An LED array according to claim 13, wherein the non-transparent or substantially non-transparent material functions as an interlayer dielectric.

16. An LED array, comprising:
   at least two raised mesa areas;
   located between the at least two raised mesa areas there is a trench;

on the upper surface of the at least two raised mesa areas there are pixels and N-bus formations along with an annealed metal area and a p-metal layer;

wherein the trench is at least partially filled with a non-transparent or substantially non-transparent material capable of blocking light emitted from within the LED; and wherein the non-transparent or substantially non-transparent material forms a layer which is non-transparent or substantially non-transparent to light at the emission wavelength of the LED array.

17. An LED array according to claim 16, wherein the LED array is a micro-LED array.

18. An LED array according to claim 16, wherein the non-transparent or substantially non-transparent material functions as an interlayer dielectric.

19. An LED array, comprising:
   at least two raised mesa areas;
   located between the at least two raised mesa areas there is a trench;
   on the upper surface of the at least two raised mesa areas there are pixels and N-bus formations along with an annealed metal area and a p-metal layer;
   wherein the trench is at least partially filled with a non-transparent or substantially non-transparent material capable of blocking light emitted from within the LED;
   wherein the non-transparent or substantially non-transparent material in polymeric form allows metals such as deposited p-metal layer to be conformably deposited thereby further reducing the light scattering from the trench; and
   wherein the polymeric material also provides optical and electrical isolation between emitters or between an emitter and any adjacent structure.

20. An LED array according to claim 19, wherein the LED array is a micro-LED array.

21. An LED array according to claim 19, wherein the non-transparent or substantially non-transparent material functions as an interlayer dielectric.

22. An LED array, comprising:
   at least two raised mesa areas;
   located between the at least two raised mesa areas there is a trench;
   on the upper surface of the at least two raised mesa areas there are pixels and N-bus formations along with an annealed metal area and a p-metal layer;
   wherein the trench is at least partially filled with a non-transparent or substantially non-transparent material capable of blocking light emitted from within the LED; and
   wherein the deposited non-transparent or substantially non-transparent material also functions to effectively isolate each pixel and p-contact from n-contacts, thereby eliminating the undesirable electric crosstalk and improving the device reliability.

23. An LED array according to claim 22, wherein the LED array is a micro-LED array.

24. An LED array according to claim 22, wherein the non-transparent or substantially non-transparent material functions as an interlayer dielectric.

* * * * *